United States Patent
Chachad et al.

(10) Patent No.: US 8,607,000 B2
(45) Date of Patent: Dec. 10, 2013

(54) EFFICIENT CACHE ALLOCATION BY OPTIMIZING SIZE AND ORDER OF ALLOCATE COMMANDS BASED ON BYTES REQUIRED BY CPU

(75) Inventors: Abhijeet Ashok Chachad, Plano, TX (US); Roger Kyle Castille, Houston, TX (US); Joseph Raymond Michael Zbiciak, Arlington, TX (US); Dheera Balasubramanian, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 122 days.

(21) Appl. No.: 13/243,411

(22) Filed: Sep. 23, 2011

(65) Prior Publication Data

US 2012/0198160 A1    Aug. 2, 2012

Related U.S. Application Data

(60) Provisional application No. 61/387,283, filed on Sep. 28, 2010.

(51) Int. Cl.
*G06F 12/04*    (2006.01)
*G06F 12/12*    (2006.01)

(52) U.S. Cl.
USPC .................. 711/129; 711/133; 711/E12.043; 711/E12.046; 711/E12.069

(58) Field of Classification Search
USPC .................. 711/129, 133, E12.043, E12.046, 711/E12.069
See application file for complete search history.

(56) References Cited

U.S. PATENT DOCUMENTS

| | | | |
|---|---|---|---|
| 8,140,764 B2* | 3/2012 | Shen et al. | 711/129 |
| 2002/0065979 A1* | 5/2002 | Chauvel | 711/3 |
| 2002/0087801 A1* | 7/2002 | Bogin et al. | 711/137 |
| 2004/0103251 A1* | 5/2004 | Alsup | 711/122 |

\* cited by examiner

*Primary Examiner* — Hal Schnee
(74) *Attorney, Agent, or Firm* — Robert D. Marshall, Jr.; Wade James Brady, III; Frederick J. Telecky, Jr.

(57) ABSTRACT

This invention is a data processing system having a multi-level cache system. The multi-level cache system includes at least first level cache and a second level cache. Upon a cache miss in both the at least one first level cache and the second level cache the data processing system evicts and allocates a cache line within the second level cache. The data processing system determine from the miss address whether the request falls within a low half or a high half of the allocated cache line. The data processing system first requests data from external memory of the miss half cache line. Upon receipt data is supplied to the at least one first level cache and the CPU. The data processing system then requests data from external memory for the other half of the second level cache line.

13 Claims, 8 Drawing Sheets

FIG. 1
(PRIOR ART)

(1) L1I CACHE MISS FILL FROM L2
(2) L1D CACHE MISS FILL FROM L2
(3) L1D WRITE MISS TO L2, OR L1D VICTIM TO L2, OR L1D SNOOP RESPONSE TO L2
(4) L2 CACHE MISS FILL, OR DMA INTO L2
(5) L2 VICTIM WRITE BACK, OR DMA OUT OF L2
(6) DMA INTO L2
(7) DMA OUT OF L2

| 31 ○○○ 29 | 28 | 27 ○○○ 23 | 22 ○○○ 18 | 17 ○○○ 13 | 12 ○○○ 2 | 1 | 0 |
|---|---|---|---|---|---|---|---|
| creg | z | dst | src2 | scr1/cst | opcode | s | p |

EFFICIENT CACHE ALLOCATION BY OPTIMIZING SIZE AND ORDER OF ALLOCATE COMMANDS BASED ON BYTES REQUIRED BY CPU

TECHNICAL FIELD OF THE INVENTION

The technical field of this invention is caches in digital data processors.

BACKGROUND OF THE INVENTION

Digital data processors to which this invention is applicable employ a two-level memory subsystem. There are level one memories which cache and a level two memory which includes directly addressable RAM, cache or both. The RAM of the level two memory can be cached in level one All cache allocates (level one data, level one instruction and level two) are processed by a level two controller to direct memory access (DMA) controller with interfaces with the peripheral which supplied the data. The level two cache line size is preferably 128 bytes. Because this data is to be brought from an external peripheral, this data transfer can take a long time. The number of cycles needed to fetch this data affects the total amount of time that the level two controller is busy. This affects the performance of the level two controller. The latency of this fetch and the order in which data returns directly affects the stalls visible to the CPU and the performance of the system.

SUMMARY OF THE INVENTION

The at least one first level cache can include an instruction cache and a data cache. In the preferred embodiment lines of the instruction cache are ½ N bits, lines of the data cache are N bit, lines of the second level cache are 2N bits and fetches from external memory are N bits.

For an instruction fetch, half of the first received data from external memory is stored in an allocated instruction cache line simultaneously with supply of the instruction to the central processing unit. For a load instruction, the first received data from external memory is stored in an allocated data cache line simultaneously with supply of the load data to the central processing unit. For a store instruction, the first received data from external memory is stored in an allocated data cache line and the write completes in the allocated cache line.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
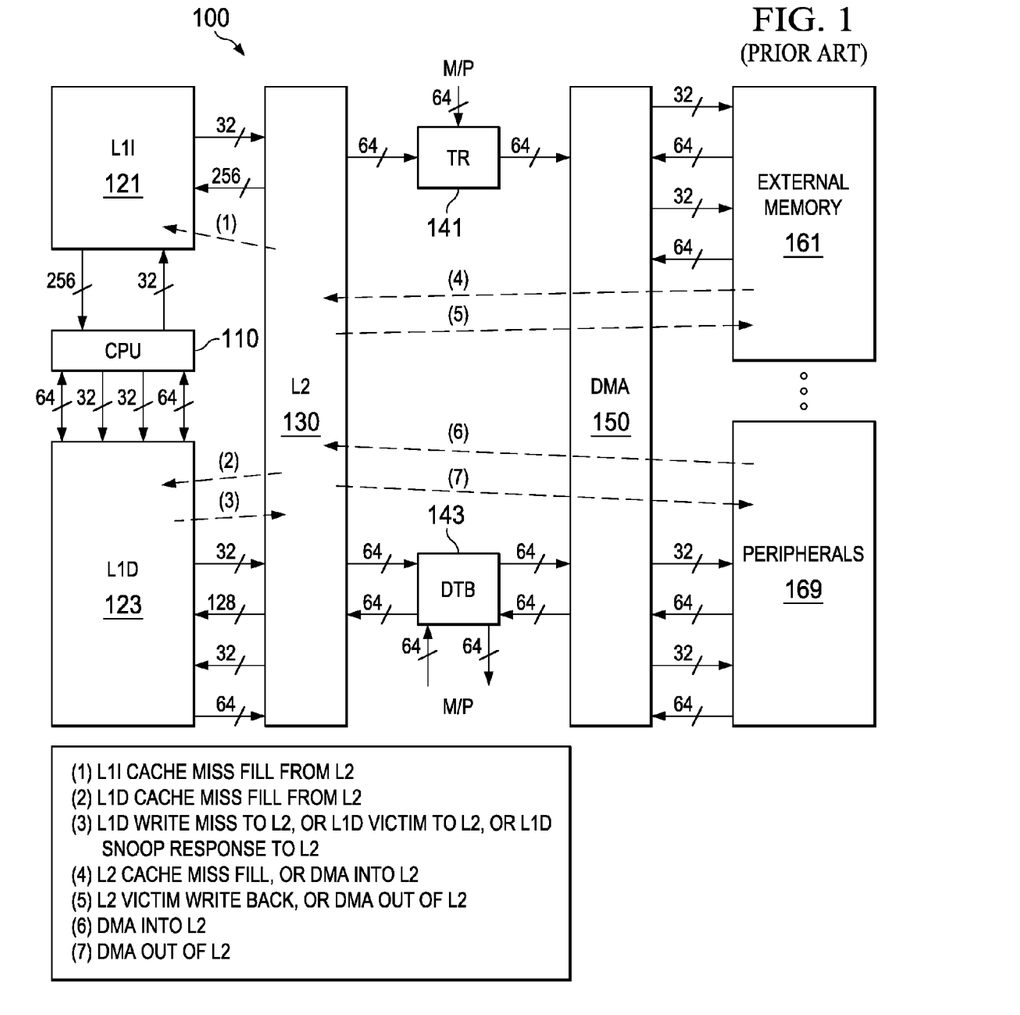
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

FIG. 1 illustrates several data/instruction movements within the digital signal processor system 100. These include: (1) instructions move from L2 cache 130 to L1I cache 121 to fill in response to a L1I cache miss; (2) data moves from L2 cache 130 to L1D cache 123 to fill in response to a L1D cache miss; (3) data moves from L1D cache 123 to L2 cache 130 in response to a write miss in L1D cache 123, in response to a L1D cache 123 victim eviction and in response to a snoop from L2 cache 130; (4) data moves from external memory 161 to L2 cache 130 to fill in response to L2 cache miss or a direct memory access (DMA) data transfer into L2 cache 130; (5) data moves from L2 cache 130 to external memory 161 in response to a L2 cache victim eviction or writeback and in response to a DMA transfer out of L2 cache 130; (6) data moves from peripherals 169 to L2 cache 130 in response to a DMA transfer into L2 cache 130; and (7) data moves from L2 cache 130 to peripherals 169 is response to a DMA transfer out of L2 cache 130.

Figure 2:
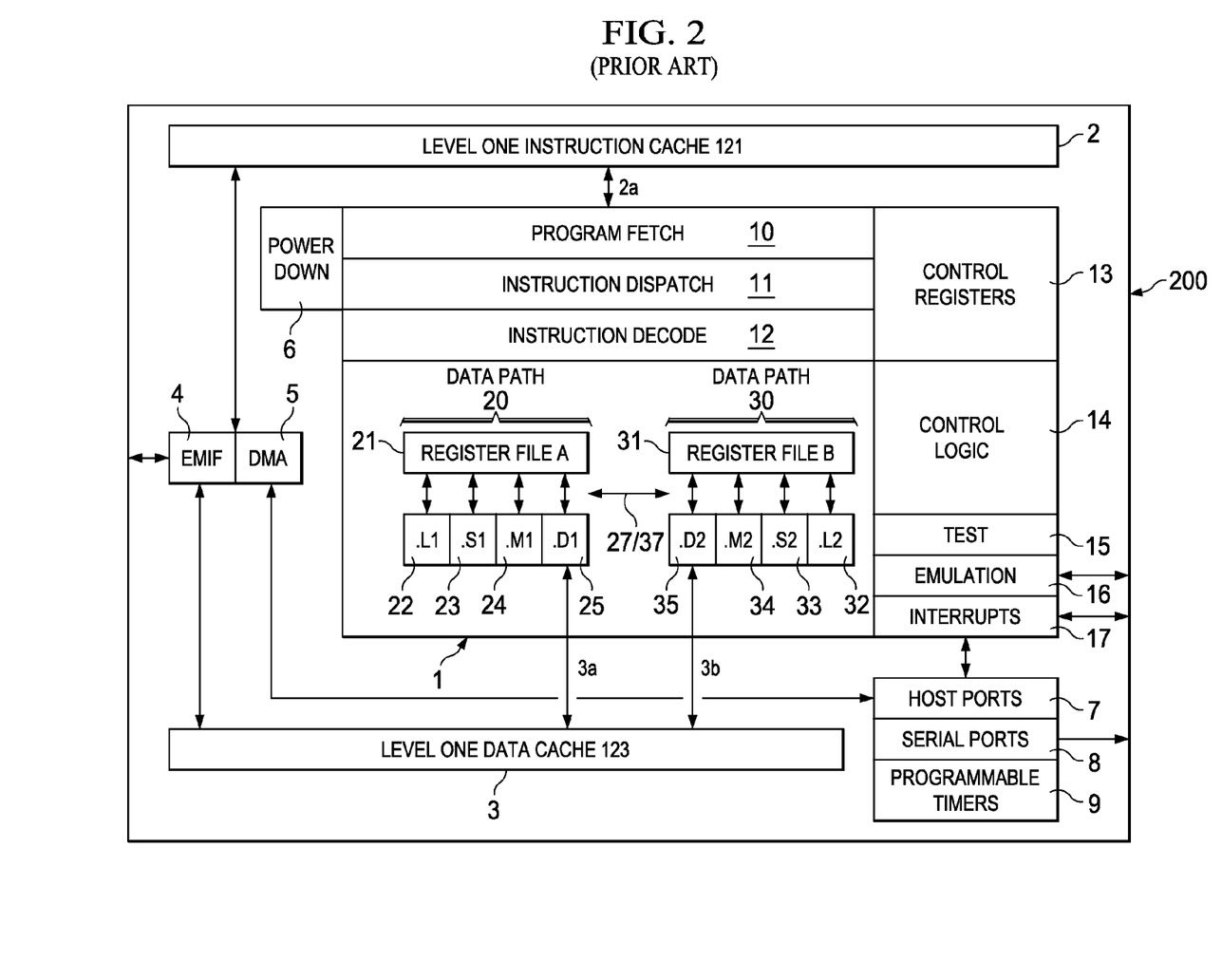
FIG. 2 illustrates details of a very long instruction word digital signal processor core suitable for use in FIG. 1 (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
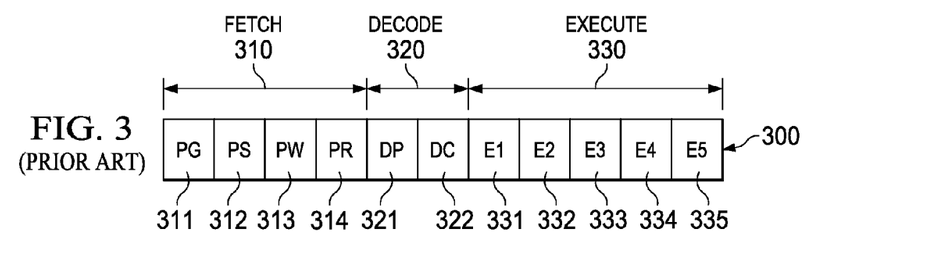
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

Figure 4:
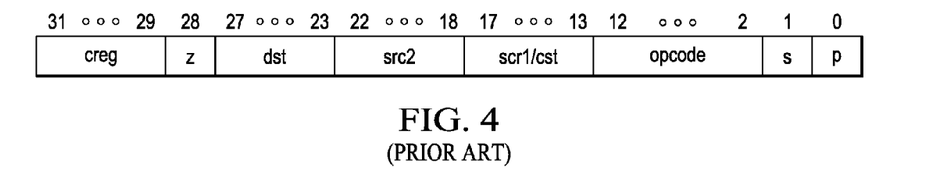
FIG. 4 illustrates the instruction syntax of the very long instruction word digital signal processor core illustrated in FIG. 2 (prior art)

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| Conditional | creg | | | z |
|---|---|---|---|---|
| Register | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

Figure 5:
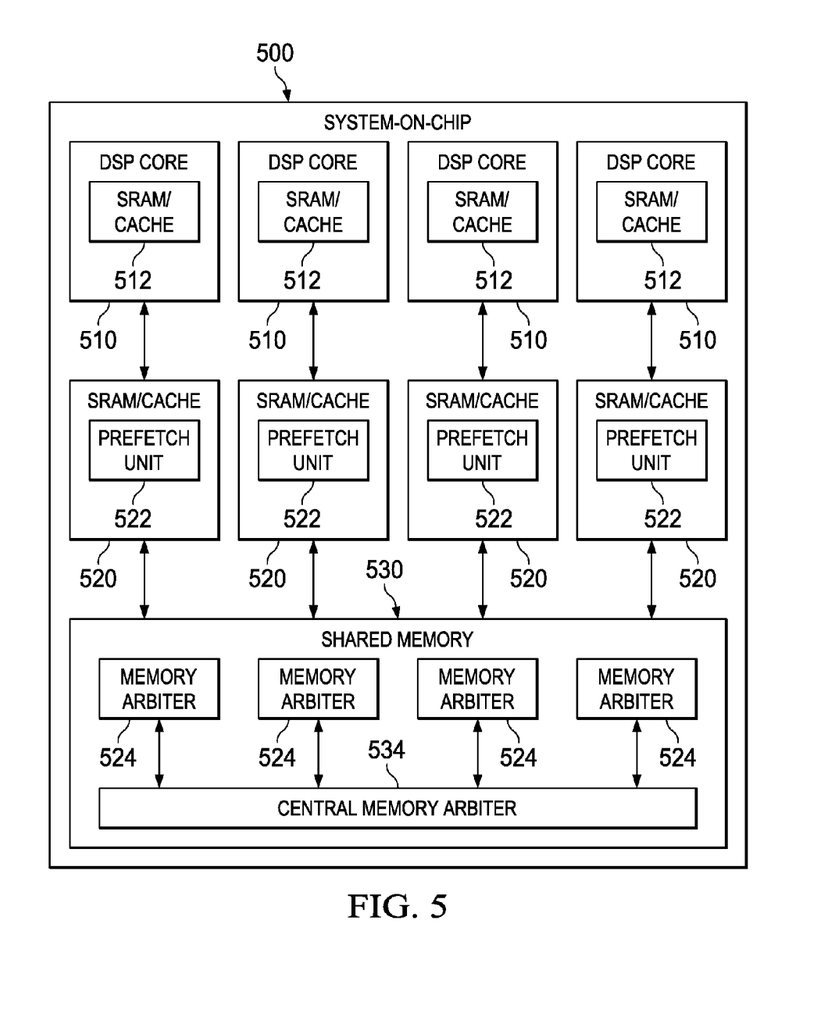
FIG. 5 illustrates a computing system including a local memory arbiter according to an embodiment of the invention.

FIG. 5 is a block diagram illustrating a computing system including a local memory arbiter according to an embodiment of the invention. FIG. 5 illustrates system on a chip (SoC) 500. SoC 500 includes one or more DSP cores 510, SRAM/Caches 520 and shared memory 530. SoC 500 is preferably formed on a common semiconductor substrate. These elements can also be implemented in separate substrates, circuit boards and packages. For example shared memory 530 could be implemented in a separate semiconductor substrate. FIG. 5 illustrates four DSP cores 510, but SoC 500 may include fewer or more DSP cores 510.

Each DSP core 510 preferably includes a level one data cache such as L1 SRAM/cache 512. In the preferred embodiment each L1 SRAM/cache 512 may be configured with selected amounts of memory directly accessible by the corresponding DSP core 510 (SRAM) and data cache. Each DSP core 510 has a corresponding level two combined cache L2 SRAM/cache 520. As with L1 SRAM/cache 512, each L2 SRAM/cache 520 is preferably configurable with selected amounts of directly accessible memory (SRAM) and data cache. Each L2 SRAM/cache 520 includes a prefetch unit 522. Each prefetch unit 522 prefetchs data for the corresponding L2 SRAM/cache 520 based upon anticipating the needs of the corresponding DSP core 510. Each DSP core 510 is further coupled to shared memory 530. Shared memory 530 is usually slower and typically less expensive memory than L2 SRAM/cache 520 or L1 SRAM/cache 510. Shared memory 530 typically stores program and data information shared between the DSP cores 510.

In various embodiments, each DSP core 510 includes a corresponding local memory arbiter 524 for reordering memory commands in accordance with a set of reordering rules. Each local memory arbiter 524 arbitrates and schedules memory requests from differing streams at a local level before sending the memory requests to central memory arbiter 534. A local memory arbiter 524 may arbitrate between more than one DSP cores 510. Central memory arbiter 534 controls memory accesses for shared memory 530 that are generated by differing DSP cores 510 that do not share a common local memory arbiter 524.

Figure 6:
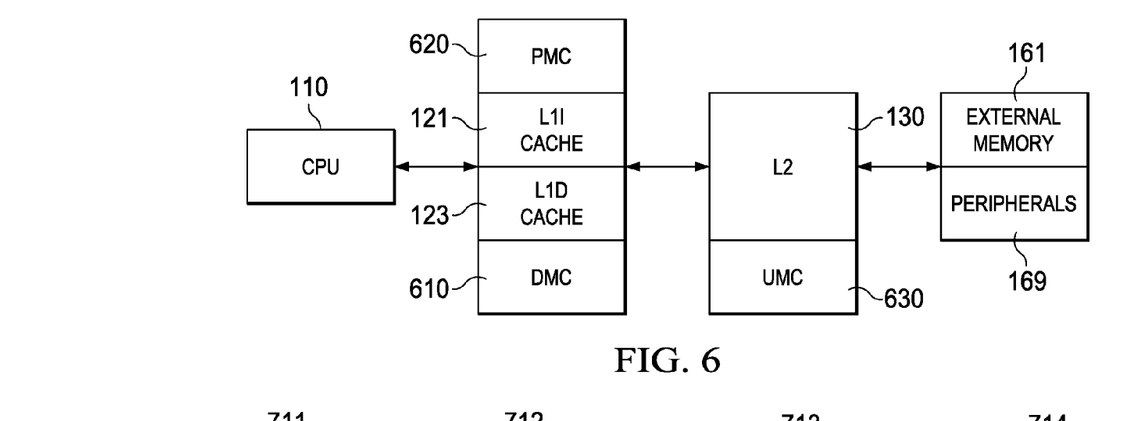
FIG. 6 is a further view of the digital signal processor system of this invention showing various cache controllers.

FIG. 6 is a further view of the digital signal processor system 100 of this invention. CPU 110 is bidirectionally connected to L1I cache 121 and L1D cache 123. L1I cache 121 and L1D cache 123 are shown together because they are at the same level in the memory hierarchy. These level one caches are bidirectionally connected to L2 130. L2 cache 130 is in turn bidirectionally connected to external memory 161 and peripherals 169. External memory 161 and peripherals 169 are shown together because they are at the same level in the memory hierarchy. Data transfers into and out of L1D cache 123 is controlled by data memory controller (DMC) 610. Data transfers into and out of L1I cache 121 is controlled by program memory controller (PMC) 620. Data transfers into and out of L2 130 including both cache and directly addressable memory (SRAM) are controlled by unified memory controller (UMC) 630. This application is primarily concerned with level 2 cache and UMC 630.

Figure 7:
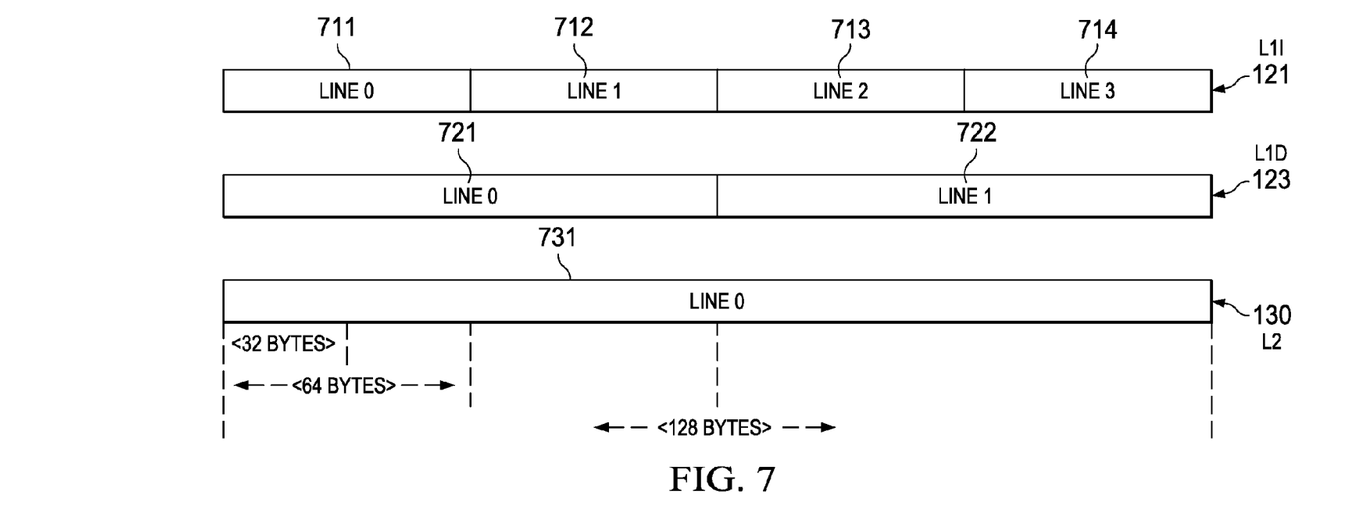
FIG. 7 illustrates the preferred cache line sizes for level one instruction cache, level one data cache and level two cache.

FIG. 7 illustrates the preferred cache line sizes for L1I cache 121, L1D cache 123 and L2 cache 130. In the preferred embodiment of this invention L2 cache line size is 128 bytes, the L1D cache line size is 64 bytes and L1I cache line size is 32 bytes. FIG. 7 illustrates cache lines line 0 711, line 1 712, line 2 713 and line 3 714 of L1I cache 121. Each cache line 711, 712, 712 and 714 includes 32 bytes. These four cache lines total 128 bytes. FIG. 7 illustrates cache lines line 0 721 and line 1 722 of L1D cache 123. Each cache line 721 and 722 includes 64 bytes. These two cache lines total 128 bytes. FIG. 7 illustrates cache line 731 of L2 cache 130. This cache line is 128 bytes.

Previous generations of TMS320C6000 family of digital signal processors the two-level memory hierarchy sent a single external request for the entire cache line. The requested data was returned in address order. CPU 110 may stall depending on where the requested data was in the cache line.

UMC 630 fetches the allocated cache line from an external source. In this invention UMC 630 optimizes this fetch by fetching the data that CPU 110 needs first. In case of an instruction fetch, the UMC 630 splits the cache line fetch request into two parts. The first part includes the 64 bytes that contain the bytes that CPU 110 needs. The second part includes the remaining bytes of the line of the L2 cache 130. In case of loads or stores that cause write allocations, the first external request by UMC 630 is for the bytes that CPU 110 needs. This corresponds to the missed L1D cache line. The second external request is for the other half of the L2 cache line. The data that CPU 110 needs is thus returned to CPU 110 via the corresponding cache as soon as it arrives. Other data to fill the L2 cache line is accumulated. This unstalls CPU 110. Thus while UMC 630 remains busy receiving the rest of the 12 cache line, CPU 110 does not stall.

Figure 8A:
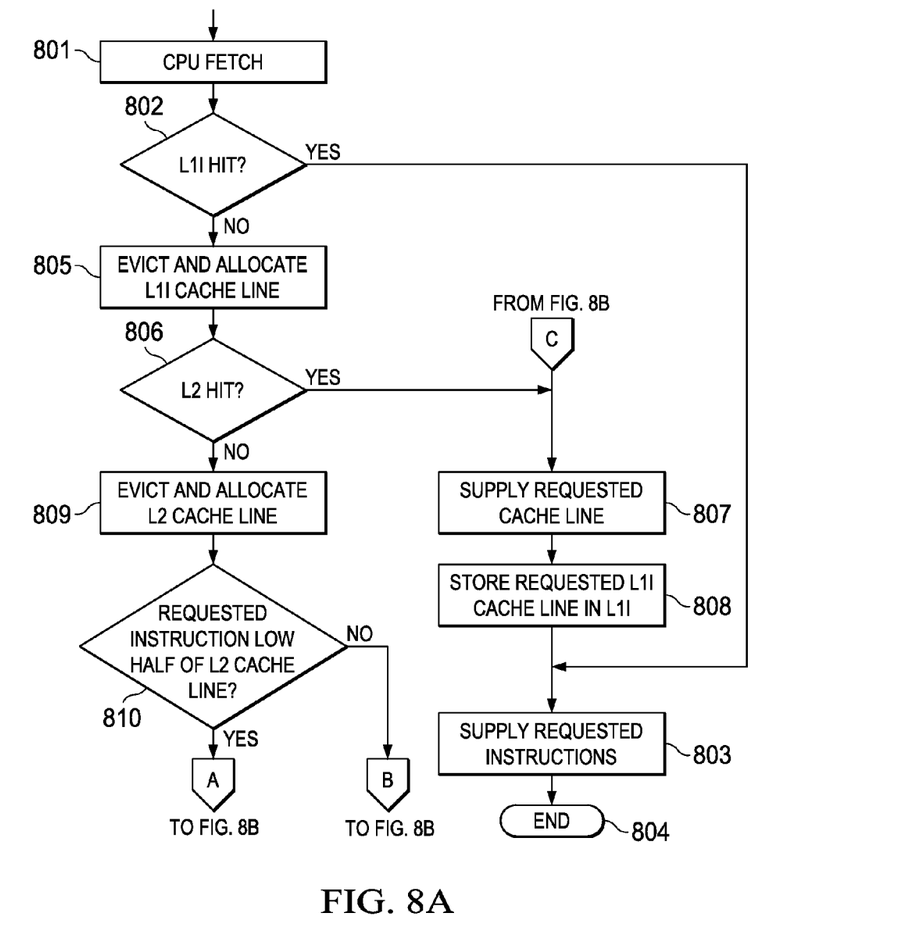
FIGS. 8A and 8B together illustrate the process of a preferred embodiment of this invention for an instruction fetch.
Figure 8B:
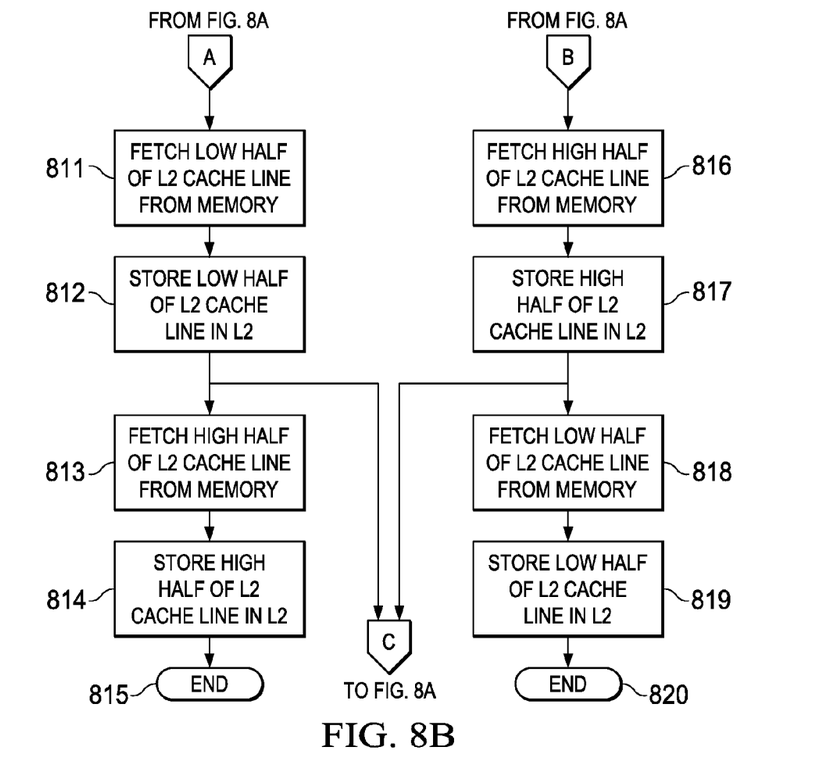

FIGS. 8A and 8B together illustrate the process of a CPU 110 instruction fetch. Block 801 is the instruction fetch. PMC 620 determines whether this fetch is a hit in L1I 121 in test block 802. If this instruction fetch is a hit (Yes in instruction block 802), then PMC 620 supplies the fetched instruction(s) from L1I cache 121 to CPU 110 at block 803. This ends the instruction fetch process at block 804.

If this instruction fetch is a miss in L1I cache 121 (No in test block 802), then PMC 620 evicts and allocates an L1I cache line in block 805. In the preferred embodiment L1I cache 121 is direct mapped. This means that data from external memory 161 can reside in only one cache line in L1I cache 121. This line corresponds to the address generating the cache miss. Thus PMC 620 evicts and allocates this line in L1I cache 121. The preferred embodiment does not support writes into L1I cache 121. Thus this evicted and allocated cache line cannot be dirty and no data needs to be written back.

In test block 806 UMC 630 determines whether the instruction fetch is a hit in L2 cache 130. If this instruction fetch is a hit in L2 cache 130 (Yes in test block 806), then UMC 630 supplies the requested cache line to L1I cache 121 in block 807. PMC 620 stores this just supplied data into the allocated line (block 808) and supplies the fetched instruction(s) to CPU 110 (block 803). It is known in the art that storing this received data in the cache and supplying data to CPU 110 can occur in parallel. This ends the instruction fetch process at block 804.

If this instruction fetch is a miss in L2 cache 130 (No in test block 806), then UMC 630 evicts and allocates an L2 cache line in block 809. In the preferred embodiment L2 cache 130 is four way set associative. Thus any address from an external source may alias into one of four cache lines or ways. UMC 630 determines which of these cache ways to evict. In accordance with the preferred embodiment of this invention, the evicted way is the least recently used way. Data can be written to within L2 cache 130 and thus can be dirty. Also as part of block 809, UMC 630 determines whether the way to be evicted is dirty. If it is dirty, then UMC 630 writes back the changed data before it is deleted.

In test block 810 UMC 630 determines whether the requested instruction(s) of the original instruction fetch aliased to the low half of the allocated L2 cache line. If the requested instruction(s) is in the low half of the L2 cache line (Yes in test block 810), then UMC 630 fetches the low half L2 cache line from external memory 161 in block 811. UMC 630 stores the received low half line in L2 cache 130 in block 812.

Operations now split into two paths. On a first path, UMC 630 supplies the requested cache line to L1I cache 121 in block 807. PMC 620 stores this just supplied data into the allocated line (block 808) and supplies the fetched instruction(s) to CPU 110 (block 803). It is known in the art that storing this received data in the level one cache and supplying data to CPU 110 can occur in parallel. Further the storing the returned data in the low half L2 cache line (block 812) could also occur in parallel with storing this received data in the level one cache and supplying data to CPU 110. This ends the instruction fetch process at block 804. On the second path, 630 fetches the high half L2 cache line from external memory 161 in block 813. UMC 630 stores the received high half line in L2 cache 130 in block 814. This ends the instruction fetch process at block 815.

If the requested instruction(s) is in the high half of the L2 cache line (No in test block 810), then UMC 630 fetches the high half L2 cache line from external memory 161 in block 816. UMC 630 stores the received high half line in L2 cache 130 in block 817.

Operations now split into two paths. On a first path, UMC 630 supplies the requested cache line to L1I cache 121 in block 807. PMC 620 stores this just supplied data into the allocated line (block 808) and supplies the fetched instruction(s) to CPU 110 (block 803). It is known in the art that storing this received data in the cache and supplying data to CPU 110 can occur in parallel. Further the storing the returned data in the high half L2 cache line (block 817) could also occur in parallel with storing this received data in the level one cache and supplying data to CPU 110. This ends the instruction fetch process in block 804. On the second path, 630 fetches the low half L2 cache line from external memory 161 in block 818. UMC 630 stores the received low half line in L2 cache 130 in block 819. This ends the instruction fetch process in block 820.

Figure 9A:
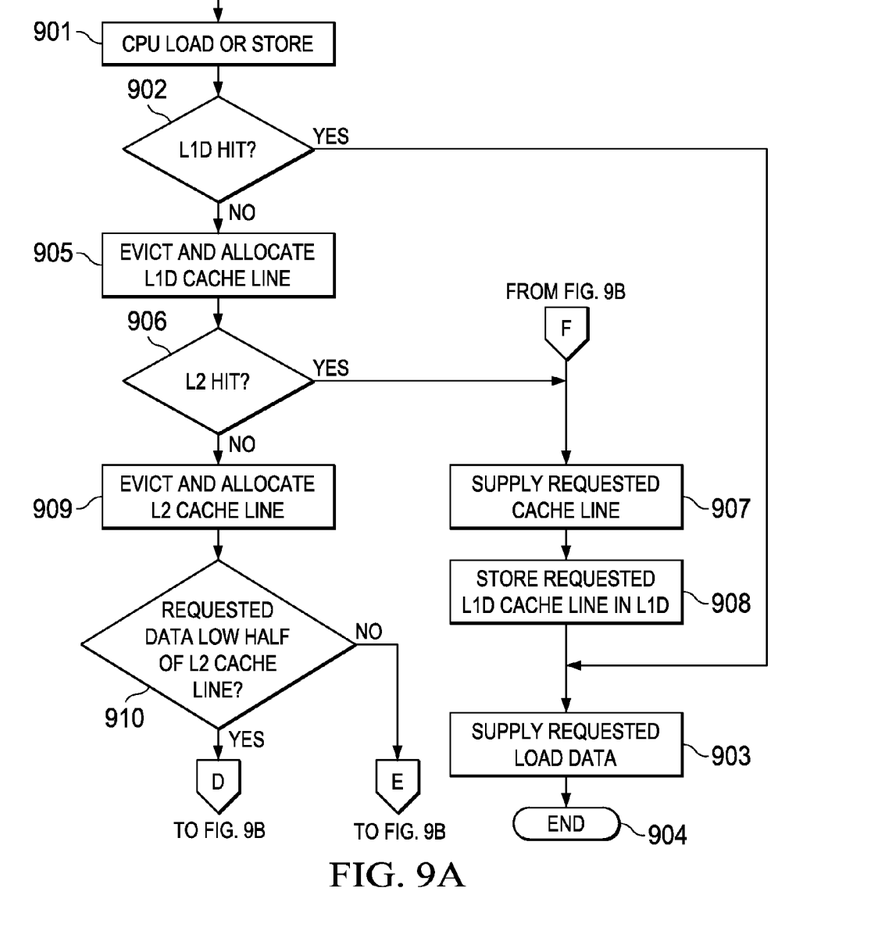
FIGS. 9A and 9B together illustrate the process of a preferred embodiment of this invention for load instruction or store instruction with write allocate.
Figure 9B:
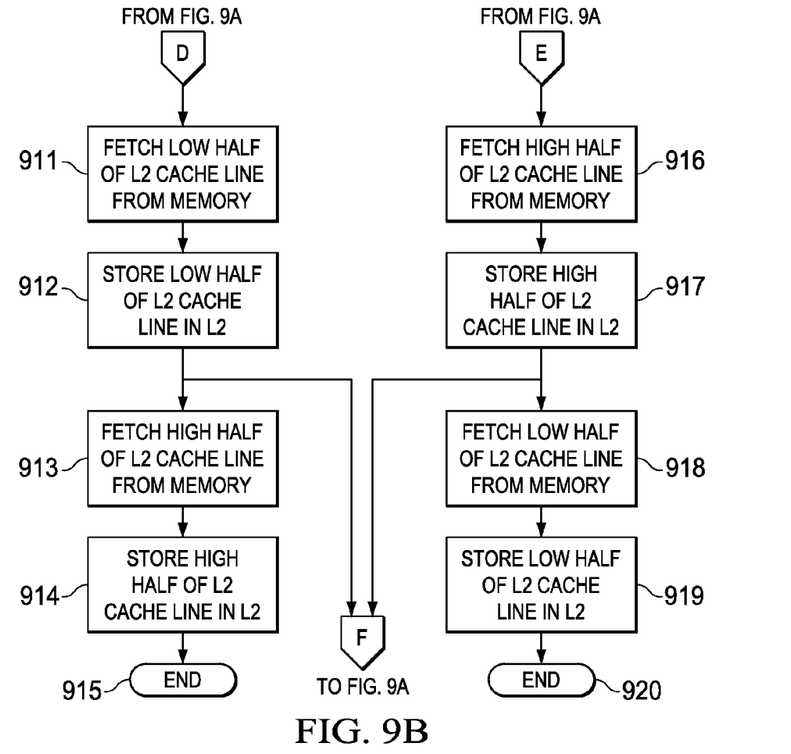

FIGS. 9A and 9B together illustrate the process of a CPU 110 load or store with allocate. A write allocate on a load instruction that misses in L1D cache 123 is described below. However, it is not necessary to provide such a write allocate. A store operation generating a miss generates a write through operation if write allocation is not supported. This invention still includes substantial utility in the absence of write allocation. Block 901 is the load or store instruction with write allocation. DMC 610 determines whether this load or store is a hit in L1D 123 in test block 902. If this load or store is a hit (Yes in instruction block 902), then DMC 610 supplies the requested load data from L1D cache 123 to CPU 110 (block 903). This ends the data fetch process in block 904.

If this load or store instruction is a miss in L1D cache 123 (No in test block 902), then DMC 610 evicts and allocates an L1D cache line in block 905. DMC 610 determines which cache way to which the requested data aliases to evict. In the preferred embodiment L1D cache 123 is two way set associative. This means that data from external memory 161 can reside in two cache lines in L1D cache 123. In accordance with the preferred embodiment of this invention, the evicted way is the least recently used way. Thus DMC 610 evicts and allocates this line in L1D cache 123. Data can be written to within L1D cache 123 and thus can be dirty. Also as part of block 905, DMC 610 determines whether the way to be evicted is dirty. If it is dirty, then DMC 610 writes back the changed data before it is deleted.

In test block 906 UMC 630 determines whether the load or store is a hit in L2 cache 130. If this load instruction is a hit in L2 cache 130 (Yes in test block 905), then UMC 630 supplies the requested cache line to L1D cache 123 in block 907. DMC 610 stores this just supplied data into the allocated line (block 908). If the instruction was a store (write) operation, the write completes within the L1D cache line. If the instruction was a load (read), DMC 610 supplies the requested load data to CPU 110 (block 903). It is known in the art that storing this received data in the cache and supplying data to CPU 110 can occur in parallel. This ends the data fetch process in block 904.

If this load or store instruction is a miss in L2 cache 130 (No in test block 906), then UMC 630 evicts and allocates an L2 cache line in block 909. In the preferred embodiment L2 cache 130 is four way set associative. Thus any address from an external source may alias into one of four cache lines or ways. UMC 630 determines which cache way to which the requested data aliases to evict. In accordance with the preferred embodiment of this invention, the evicted way is the least recently used way. Data can be written to within L2 cache 130 and thus can be dirty. Also as part of block 909, UMC 630 determines whether the way to be evicted is dirty. If it is dirty, then UMC 630 writes back the changed data before it is deleted.

In test block 910 UMC 630 determines whether the requested data of the original load or store instruction aliased to the low half of the allocated L2 cache line. If the requested data is in the low half of the L2 cache line (Yes in test block 910), then UMC 630 fetches the low half L2 cache line from external memory 161 in block 911. UMC 630 stores the received low half line in L2 cache 130 in block 912.

Operations now split into two paths. On a first path, UMC 630 supplies the requested cache line to L1D cache 123 in block 907. DMC 610 stores this just supplied data into the allocated line (block 908). If the instruction was a store (write) operation, the write completes within the L1D cache line. If the instruction was a load (read), DMC 610 supplies the requested load data to CPU 110 (block 903). It is known in the art that storing this received data in the cache and supplying data to CPU 110 can occur in parallel. Further the storing the returned data in the low half L2 cache line (block 912) could also occur in parallel with storing this received data in the level one cache and supplying data to CPU 110. This ends the data fetch process in block 904. On the second path, 630 fetches the high half L2 cache line from external memory 161 in block 913. UMC 630 stores the received high half line in L2 cache 130 in block 914. This ends the load or store instruction process in block 915.

If the requested instruction(s) is in the high half of the L2 cache line (No in test block 910), then UMC 630 fetches the high half L2 cache line from external memory 161 in block 916. UMC 630 stores the received high half line in L2 cache 130 in block 917.

Operations now split into two paths. On a first path, UMC 630 supplies the requested cache line to L1D cache 123 in block 907. DMC 610 stores this just supplied data into the allocated line (block 908). If the instruction was a store (write) operation, the write completes within the L1D cache line. If the instruction was a load (read), DMC 610 supplies the requested load data to CPU 110 (block 903). It is known in the art that storing this received data in the cache and supplying data to CPU 110 can occur in parallel. Further the storing the returned data in the high half L2 cache line (block 917) could also occur in parallel with storing this received data in the level one cache and supplying data to CPU 110. This ends the load or store instruction process in block 904.

On the second path, 630 fetches the low half L2 cache line from external memory 161 in block 918. UMC 630 stores the received low half line in L2 cache 130 in block 919. This ends the load or store instruction process in block 920.

This improves allocate performance by a huge factor depending on the bytes that CPU requires. When the bytes that CPU 110 requires is in position 32 to 63 or 98 to 127, this causes an improvement of 200%

The stalls visible to CPU 110 are most critical to the performance of the application. This scheme minimizes such stalls by fetching the data that CPU 110 needs first. Because the CPU unstalls as soon as it receives the data it needs. This improves fetch performance. The improvement can be as large as 200% for instruct fetches where the L1I cache line is the last half of the L2 cache line.

What is claimed is:

1. A data processing system comprising:
a central processing unit executing program instructions to manipulate data;
at least one first level cache connected to said central processing unit temporarily storing in a plurality of cache lines at least one of program instructions for execution by said central processing unit and data for manipulation by said central processing unit, said at least one first level cache having a cache line size of less than or equal to N bits; and
a second level cache connected to said first level cache temporarily storing in a plurality of cache lines at least one of program instructions for execution by said central processing unit and data for manipulation by said central processing unit, said second level cache having a cache line size of 2N bits; and
a cache operation unit connected to said at least one first level cache and said second level cache operable upon a cache miss in said at least one first level cache and a cache miss in said second level cache in response to a request from said central processing unit at a generated address, said cache operation unit operable to
evict and allocate a cache line within said second level cache to store a cache line including said central processing unit generated address,
determine from said central processing unit generated address whether said request of said central processing unit falls within a low half or a high half of said allocated cache line within said second level cache,
if said request of said central processing unit falls within said low half of said allocated cache line within said second level cache (1) requesting a first N bits from an external memory corresponding to said low half of said allocated cache line within said second level cache, (2) upon receipt of said first N bits, supplying at least a subset of said N bits to said at least one first level cache and storing said first N bits in said low half of said allocated cache line within said second level cache, (3) requesting a second N bits from the external memory corresponding to said high half of said allocated cache line, (4) upon receipt of said second N bits, storing said second N bits in said high half of said allocated cache line within said second level cache, and
if said request of said central processing unit falls within said high half of said allocated cache line within said second level cache (1) requesting a first N bits from an external memory corresponding to said high half of said allocated cache line within said second level cache, (2) upon receipt of said first N bits, supplying at least a subset of said N bits to said at least one first level cache and storing said first N bits in said high half of said allocated cache line within said second level cache, (3) requesting a second N bits from the external memory corresponding to said low half of said allocated cache line within said second level cache, (4) upon receipt of said second N bits, storing said second N bits in said low half of said allocated cache line within said second level cache.

2. The data processing system of claim 1, wherein:
said at least one first level cache includes an instruction cache storing instructions used by said central processing unit; and
said request from said central processing unit is an instruction fetch.

3. The data processing system of claim 2, wherein:
said instruction cache has a cache line size of ½ N;
said at least a subset of said N bits to said at least one first level cache consists of ½ N bits including an instruction of said central processing unit instruction fetch.

4. The data processing system of claim 2, wherein:
upon supply of said at least a subset of said N bits to said instruction cache, said instruction cache simultaneously stores said at least a subset of said N bits in an allocated cache line within said instruction cache and supplies an instruction of said central processing unit instruction fetch to said central processing unit.

5. The data processing system of claim 1, wherein:
said at least one first level cache includes a data cache storing data used by said central processing unit; and
said request from said central processing unit is a load instruction.

6. The data processing system of claim 5, wherein:
said data cache has a cache line size of N;
said at least a subset of said N bits supplied to said at least one first level cache consists of N bits including data of said central processing unit load instruction.

7. The data processing system of claim 5, wherein:
upon supply of said at least a subset of said N bits to said data cache, said data cache simultaneously stores said subset of said N bits in an allocated cache line within said data cache and supplies data of said central processing unit load instruction to said central processing unit.

8. The data processing system of claim 1, wherein:
said at least one first level cache includes a data cache storing data used by said central processing unit; and
said request from said central processing unit is a store instruction which triggers an allocation within said data cache.

9. The data processing system of claim 8, wherein:
said data cache has a cache line size of N;
said at least a subset of said N bits supplied to said at least one first level cache consists of N bits including data of said central processing unit store instruction which triggers an allocation within said data cache.

10. The data processing system of claim 8, wherein:
upon supply of said at least a subset of said N bits to said data cache, said data cache stores said subset of said N in an allocated cache line within said data cache and completes said store instruction in said allocated cache line.

11. The data processing system of claim 1, wherein:
said at least one first level cache includes an instruction cache storing instructions used by said central processing unit and a data cache storing data used by said central processing unit;
said request from said central processing unit is one of an instruction fetch, a load instruction and a store instruction which triggers an allocation within said data cache.

12. The data processing system of claim 11, wherein:
said instruction cache has a cache line size of ½ N;
said data cache has a cache line size of N;
said at least a subset of said N bits to said at least one first level cache consists of
½ N bits for said central processing unit instruction fetch,
N bits for said central processing unit load instruction, and
N bits for said central processing unit store instruction which triggers an allocation within said data cache.

13. The data processing system of claim 11, wherein:
upon supply of said at least a subset of said N bits to said instruction cache, said instruction cache simultaneously stores said subset of said N bits in an allocated cache line within said instruction cache and supplies an instruction of said central processing unit instruction fetch to said central processing unit;
upon supply of said at least a subset of said N bits to said data cache in response to a load instruction, said data cache simultaneously stores said subset of said N bits in an allocated cache line within said data cache and supplies data corresponding to said load instruction to said central processing unit; and
upon supply of said at least a subset of said N bits to said data cache in response to a store instruction which triggers an allocation within said data cache, said data cache stores said subset of said N bits in an allocated cache line within said data cache and completes said store instruction in said allocated cache line.

* * * * *